United States Patent [19]

Jordan et al.

[11] 3,959,565

[45] May 25, 1976

[54] TIN OXIDE COATING

[75] Inventors: John F. Jordan; Curtis M. Lampkin, both of El Paso, Tex.

[73] Assignee: D. H. Baldwin Company, Cincinnati, Ohio

[22] Filed: Sept. 12, 1974

[21] Appl. No.: 505,364

Related U.S. Application Data

[63] Continuation-in-part of Ser. No. 431,705, Jan. 8, 1974, Pat. No. 3,880,633.

[52] U.S. Cl. ............................. 428/432; 427/110; 427/314; 427/422; 427/424; 427/427; 428/539
[51] Int. Cl.² ...................... B32B 15/00; B05D 5/12
[58] Field of Search ................. 117/211, 54, 124 A, 117/124 B; 65/60; 427/110, 422, 424, 427, 314; 428/432, 539

[56] References Cited
UNITED STATES PATENTS

| | | | |
|---|---|---|---|
| 2,522,531 | 9/1950 | Mochel | 117/54 |
| 2,566,346 | 9/1951 | Lytle et al. | 117/54 |
| 2,724,658 | 11/1955 | Lytle | 117/54 |
| 2,733,325 | 1/1956 | Cox | 117/54 |
| 3,107,177 | 10/1963 | Saunders et al. | 117/54 |

*Primary Examiner*—Michael F. Esposito
*Attorney, Agent, or Firm*—Kirkland & Ellis

[57] ABSTRACT

A sheet of glass coated with $SnO_x$ by intermittent spraying of a mixture of materials in non-aqueous solution and in an oxidizing atmosphere, while maintaining the glass at a fixed temperature by supporting the glass in molten liquid at a controlled temperature, the spraying being conducted in successive passes involving small amounts of spray per pass, and the sheet of glass moving continuously along a pool of the molten liquid during the spraying process.

8 Claims, No Drawings

TIN OXIDE COATING

This application is a continuation-in-part of our prior application for U.S. Pat., Ser. No. 431,705, now U.S. Pat. No. 3,880,633 filed Jan. 8, 1974, and assigned to the assignee of the present application.

BACKGROUND OF THE INVENTION

In our prior application, Ser. No. 431,705, now U.S. Pat. No. 3,880,633 was disclosed a method of coating a glass sheet with a thin film of $SnO_x$, in a continuous process, the glass moving continuously in a bath of molten material, and a spray containing a tin compound being applied in successive transverse passes of the glass. The glass moves in a bath of molten material which may be tin, but may also be a salt, capable of sustaining the glass or partially sustaining the glass. In the latter case further support is supplied for the glass, so that its upper surface remains exposed, while at least its under surface is immersed. The contents of Ser. No. 431,705 are incorporated herein by reference.

It is known to coat glass with $SnO_x$, and it is also known that if glass is coated with $SnO_x$, the $SnO_x$ being transparent and electrically conducting, the coating will serve to reflect infra-red energy while passing visible light, so that heating energy applied internally of a heated enclosure, employing one or more panes of such coated glass, is conserved internally of the enclosure since radiation of infra-red energy outwardly of the structure through the glass is reduced. It is an object of the present invention to improve such coatings in such manner as to increase infra-red reflectivity of the $SnO_x$ coating, while maintaining good transmission in the visible spectrum. The increase is a function of the reduced resistivity of the film, which is about 8–17 ohms per square, transmissibility of visible light being about 80%. Conventional coatings have resistivities of about 50–90 ohms per square and transmissibilities of about 70–78%. As Ω/sq. is reduced transmissibility of visible light is not radically reduced but a large increase of infra-red reflectivity occurs.

SUMMARY OF THE INVENTION

Glass coated with $SnO_x$ having a resistivity of about 8–17 ohms per square and having reflectivity to infra-red energy of about 82%, coupled with substantially 80% transmissivity of visible rays, the coating being formed by an intermittent spraying process while supplying heat from a liquid bath involving spraying a non-aqueous solution of phenyl hydrazene hydrochloride, ammonium bifluoride, tin chloride (anhydrous), carried out at a substantially constant temperature.

DETAILED DISCLOSURE OF SPECIFIC EMBODIMENT

EXAMPLE I

A molten bath is preheated to 600°F. A glass plate is heated to 500°F and moves along the bath. The bath is heated so that the exposed surface of the glass is at about 950°F. Spraying is accomplished by means of an air atomizing nozzle of an air spray, at 40 PSI for about 1 ½ minutes, at 50 cc per minute. The following solution is employed:

| | |
|---|---|
| 250. ml | methanol |
| 0.7 gm | phenyl hydrazene hydrochloride |
| 3.0 gm | ammonium bifluoride ($NH_4FHF$) |
| 70. gm | $SnCl_2$ (anhydrous) |

The solution should be stirred for about five minutes before spraying, to clear the solution.

The solvent must not contain water, but methanol is employed as a solvent only because it is the most economical solvent available. Other non-aqueous solvents may be employed. The phenyl hydrazene hydrochloride may be omitted, but its presence has been found to reduce haze in the film. The proportions specified are selected on an economic and not a chemical basis, i.e., the smallest amount is employed which is satisfactory in producing a clear film. $NH_4FHF$ is a dopant, which can decrease film resistivity by a large factor, as much as 300%. The quantity of $NH_4FHF$ employed is selected on an economic basis, i.e., as little is used as is consistent with desired resistivity values.

The coating formed is about .3–.6 microns thick. The coated glass has reflectivity for infra-red of about 82%. The best prior art $SnO_x$ coated glass with high transmission of the visible spectrum has an infra-red reflectivity of about 50%.

It is crucial, in the process of the invention, in order to achieve the desired characteristics of low resistivity, high reflectivity to infra-red radiation, and high transmissivity of the visible spectrum in a thin film coating, to supply heat to the glass continuously and uniformly and at uniform temperature. This cannot be accomplished by placing the glass on a heated surface, nor in an oven, but only by means of a heated liquid bath in which the glass is supported and which constitutes a large capacity heat reservoir to which the bottom surface of the glass is exposed. It is required that spraying be accomplished intermittently, and very slowly, so that the temperature of the exposed surface of the glass can recover between sprays, and so that the glass is not cooled appreciably by the sprays. It is important that the sprayed mixture be anhydrous, and that environmental water be avoided, and that all supply lines, spray heads and the like be carefully flushed with methanol before spraying commences. Presence of water increases resistivity and produces spots in the film.

After the coating process is completed the glass sheet is slowly cooled, to anneal the glass, according to conventional techniques.

The present system lends itself to coating a sheet of glass with $SnO_x$, as the glass is produced by a continuous process glass making machine, as in our Ser. No. 431,705 now U.S. Pat. No. 3,880,633 which is incorporated herein by reference. Glass is produced, in such a continuous process, in long sheets about ten feet wide. Since the glass is hot when produced, its heat is employed to maintain hot the float tanks in which the coating process is carried out. The process of coating may, accordingly, be carried out as part of a continuous glass making process. The process may, however, also be carried out on pre-fabricated glass. In the latter case, the glass may be pre-heated to 950°F in a conveyor furnace, and transferred to a molten liquid tank, the liquid being heated to a temperature which maintains the exposed surface of the glass at about 950°F. In the first method the waste heat of the glass making process is employed to heat the glass, which represents an economic advantage.

Glass coated in accordance with the present method has particular advantage as window glass, for vehicles, dwellings, large buildings, hot houses, and the like. It also has application to ovens having viewing windows, and to solar heating systems, where it is desirable to avoid heat loss via infra-red radiation.

While the preferred fluoride is $NH_4FHF$, it is feasible to employ $SnF_2$, i.e., a fluoride containing only F and Sn. The function of the $NH_4FHF$ is to provide fluorine plus a volatile remainder.

The material in the float tanks may be liquid tin or a molten salt capable of being maintained at the required temperature.

We claim:

1. A method of forming a conductive film of $SnO_x$ on a window glass surface comprising:
maintaining the temperature of said surface constant at a temperature of about 950°F by floating said glass in a heated liquid bath;
spraying onto said glass surface an anhydrous solution containing anhydrous $SnCl_2$;
said spraying being conducted in an oxygen containing atmosphere, in successive, intermittent passes over said surface, each of said passes spraying only a portion of said glass surface at any instant of time, and at a rate of spray so that said temperature remains essentially constant;
said spraying further being conducted for a total time sufficient to form a film of $SnO_x$ of about 0.3 to 0.6 microns in thickness.

2. The method according to claim 1, wherein said solution is in the proportions:

| | |
|---|---|
| 250. ml | methanol |
| 0.7 gm | phenylhydrazene hydrochloride |
| 3.0 gm | ammonium bifluoride ($NH_4FHF$) |
| 70. gm | $SnCl_2$ (anhydrous). |

3. A sheet of glass coated with $SnO_x$ according to the method of claim 1 and having a resistivity in the range 8 to 17 ohms per square, with transmissivity of visible light in the range 70 to 80% and reflectivity of infra-red radiation of about 80%.

4. The method of claim 1, wherein said solution includes a non-aqueous solvent, a quantity of anhydrous $SnCl_2$ and a fluoride.

5. The method according to claim 1, wherein said anhydrous solution includes methanol, ammonium bifluoride and anhydrous $SnCl_2$.

6. The method of producing a film of $SnO_x$ on a glass substrate comprising:
spraying an anhydrous solution against a surface of said substrate in an oxygen containing atmosphere;
maintaining said surface at a temperature of about 950°F by moving said substrate along a tank of molten material, said material having a temperature selected to maintain said surface at a temperature of about 950°F during said spraying;
said solution including an anhydrous solvent, a fluorine containing material and a quantity of anhydrous $SnCl_2$;
said spraying being conducted in repeated, intermittent passes traversely over said surface, each of said passes spraying only a portion of said glass surface at any instant of time, and at a sufficiently small rate of spray so that said molten material is able to supply heat to said glass at a rate sufficient to maintain the temperature of said surface essentially constant during the spraying;
and said film being sprayed to a thickness of approximately .5 microns.

7. The method according to claim 6, wherein said fluorine containing material is $NH_4FHF$.

8. The method according to claim 6, wherein said fluorine containing material is a salt.

* * * * *